(12) United States Patent
Jang et al.

(10) Patent No.: US 11,678,552 B2
(45) Date of Patent: Jun. 13, 2023

(54) ORGANIC LIGHT EMITTING DIODE DISPLAY DEVICE

(71) Applicant: LG Display Co., Ltd, Seoul (KR)

(72) Inventors: Ji-Hyang Jang, Paju-si (KR);
Won-Hoe Koo, Paju-si (KR);
Tae-Shick Kim, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 129 days.

(21) Appl. No.: 17/196,859

(22) Filed: Mar. 9, 2021

(65) Prior Publication Data

US 2021/0217818 A1  Jul. 15, 2021

Related U.S. Application Data

(63) Continuation of application No. 16/536,209, filed on Aug. 8, 2019, now Pat. No. 10,971,558.

(30) Foreign Application Priority Data

Aug. 14, 2018 (KR) .......................... 10-2018-0094903

(51) Int. Cl.
*H01L 51/52* (2006.01)

(52) U.S. Cl.
CPC ........... *H10K 59/38* (2023.02); *H10K 50/844* (2023.02); *H10K 59/122* (2023.02)

(58) Field of Classification Search
CPC .............. H01L 27/322; H01L 27/3246; H01L 51/5253; H01L 2251/558; H01L 27/3258; H01L 51/5225; H01L 51/5209; H01L 51/5016; H01L 27/3211; H01L 27/3244; H01L 51/5275; H01L 51/5281; H01L 51/50–56; H01L 2251/50–568;
(Continued)

(56) References Cited

U.S. PATENT DOCUMENTS

| | | | |
|---|---|---|---|
| 7,071,617 | B2 | 7/2006 | Utsumi et al. |
| 10,008,697 | B2 | 6/2018 | Jang et al. |
| 10,079,365 | B2 | 9/2018 | Kim et al. |

(Continued)

FOREIGN PATENT DOCUMENTS

| | | | |
|---|---|---|---|
| CN | 1575064 A | | 2/2005 |
| CN | 106058068 A | | 10/2016 |

(Continued)

*Primary Examiner* — Shahed Ahmed
(74) *Attorney, Agent, or Firm* — Seed IP Law Group LLP

(57) ABSTRACT

Various embodiments provide an organic light emitting diode display device that includes a substrate having an emitting area and a non-emitting area; an overcoating layer on the substrate and including a convex portion and a concave portion. The convex portion includes a bottom surface portion, a top surface portion and a side surface portion between the bottom surface portion and the top surface portion. The organic light emitting diode further includes a first electrode on the overcoating layer; a light emitting layer on the first electrode; and a second electrode on the light emitting layer. The side surface portion is a main emission region having a first emission spectrum and the concave portion is an auxiliary emission region having a second emission spectrum different from the first emission spectrum. The main emission region and the auxiliary emission region are an effective emission region.

20 Claims, 8 Drawing Sheets

(58) Field of Classification Search
CPC .............. H10K 59/38; H10K 50/844; H10K 2102/351; H10K 59/122
See application file for complete search history.

(56) References Cited

U.S. PATENT DOCUMENTS

| | | |
|---|---|---|
| 10,164,216 B2 | 12/2018 | Acharya et al. |
| 10,199,607 B2 | 2/2019 | Kim et al. |
| 10,347,871 B2 | 7/2019 | Joung et al. |
| 10,468,468 B2 | 11/2019 | Joung et al. |
| 2004/0227462 A1 | 11/2004 | Utsumi et al. |
| 2007/0290607 A1 | 12/2007 | Okada et al. |
| 2017/0062769 A1 | 3/2017 | Kim et al. |
| 2017/0062770 A1 | 3/2017 | Jang et al. |
| 2017/0084676 A1 | 3/2017 | Jang et al. |
| 2017/0084875 A1 | 3/2017 | Joung et al. |
| 2017/0125489 A1 | 5/2017 | Jang et al. |
| 2017/0155094 A1* | 6/2017 | Joung .............. H01L 51/5225 |
| 2018/0006273 A1 | 1/2018 | Kim et al. |
| 2018/0175327 A1 | 6/2018 | Jang et al. |

FOREIGN PATENT DOCUMENTS

| | | |
|---|---|---|
| CN | 106486523 A | 3/2017 |
| CN | 106486525 A | 3/2017 |
| CN | 106816454 A | 6/2017 |
| CN | 106887527 A | 6/2017 |
| CN | 107565043 A | 1/2018 |
| CN | 108258134 A | 7/2018 |
| TW | 200621079 A | 6/2006 |

* cited by examiner

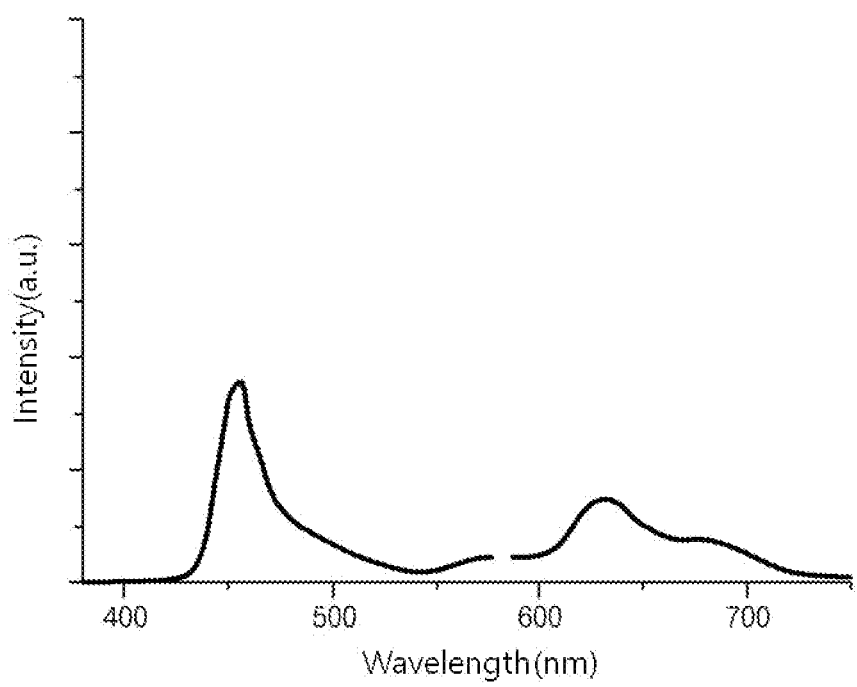

ORGANIC LIGHT EMITTING DIODE DISPLAY DEVICE

CROSS REFERENCE TO RELATED APPLICATION

The present application is a continuation of U.S. patent application Ser. No. 16/536,209, filed Aug. 8, 2019, which claims the priority benefit of Korean Patent Application No. 10-2018-0094903 filed in Republic of Korea on Aug. 14, 2018, which is hereby incorporated by reference in its entirety for all purposes as if fully set forth herein.

BACKGROUND

Technical Field

The present disclosure relates to an organic light emitting diode display device, and more particularly, to an organic light emitting diode display device where a light extraction efficiency is improved.

Description of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since inner elements of the OLED display device have a solid phase, the OLED display device has high durability against an external impact and has a wide available temperature range.

In the OLED display device, while light emitted from a light emitting layer passes through various components and is emitted to an exterior, a large amount of the light is lost. As a result, the light emitted to the exterior of the OLED display device is 20% of the light emitted from the light emitting layer.

Since the amount of the light emitted from the light emitting layer is increased along with the amount of a current applied to the OLED display device, it is possible to further increase luminance of the OLED display device by applying more currents to the light emitting layer. However, in this case, power consumption is increased, and lifetime of the OLED display device is also reduced.

Therefore, to improve a light extraction efficiency of the OLED display device, an OLED display device where a microlens array (MLA) is attached to an outer surface of a substrate or a microlens is formed in an overcoating layer has been suggested.

However, even when the microlens array is attached to the outer surface of the OLED display device or the microlens is formed in the OLED display device, a large amount of light is confined in the OLED display device and a small amount of light is extracted to an exterior.

BRIEF SUMMARY

Accordingly, the present disclosure is directed to an organic light emitting diode display device that substantially obviates one or more of the problems due to limitations and disadvantages of the related art.

Various embodiments of the present disclosure provides an organic light emitting diode display device where a light extraction efficiency is improved.

Additional features and advantages of the various embodiments of the present disclosure will be set forth in the description that follows, and in part will be apparent from the description, or may be learned by practice of the various embodiments of the present disclosure. These and other advantages of the various embodiments of the present disclosure will be realized and attained by the structure particularly pointed out in the written description and claims hereof as well as the appended drawings.

According to one embodiment of the present disclosure, an organic light emitting diode display device includes: a substrate having an emitting area and a non-emitting area; an overcoating layer on the substrate and including a convex portion and a concave portion, the convex portion including a top surface portion and a side surface portion between the concave portion and the top surface portion, the side surface portion being in a first emission region having a first emission spectrum, the concave portion being in a second auxiliary emission region having a second emission spectrum different from the first emission spectrum; a first electrode on the overcoating layer; a light emitting layer on the first electrode; and a second electrode on the light emitting layer.

It is to be understood that both the foregoing general description and the following detailed description are exemplary and explanatory and are intended to provide further explanation of the various embodiments of the present disclosure as claimed.

BRIEF DESCRIPTION OF THE DRAWINGS

The accompanying drawings, which are included to provide a further understanding of the various embodiments of the present disclosure and are incorporated in and constitute a part of this specification, illustrate embodiments of the present disclosure and together with the description serve to explain the principles of the present disclosure. In the drawings:

FIGS. 5A, 5B, 5C, and 5D are graphs showing emission spectrums of an auxiliary emission region of an organic light emitting diode display device according to an embodiment of the present disclosure.

DETAILED DESCRIPTION

Reference will now be made in detail to the present disclosure, examples of which are illustrated in the accompanying drawings.

Figure 1:
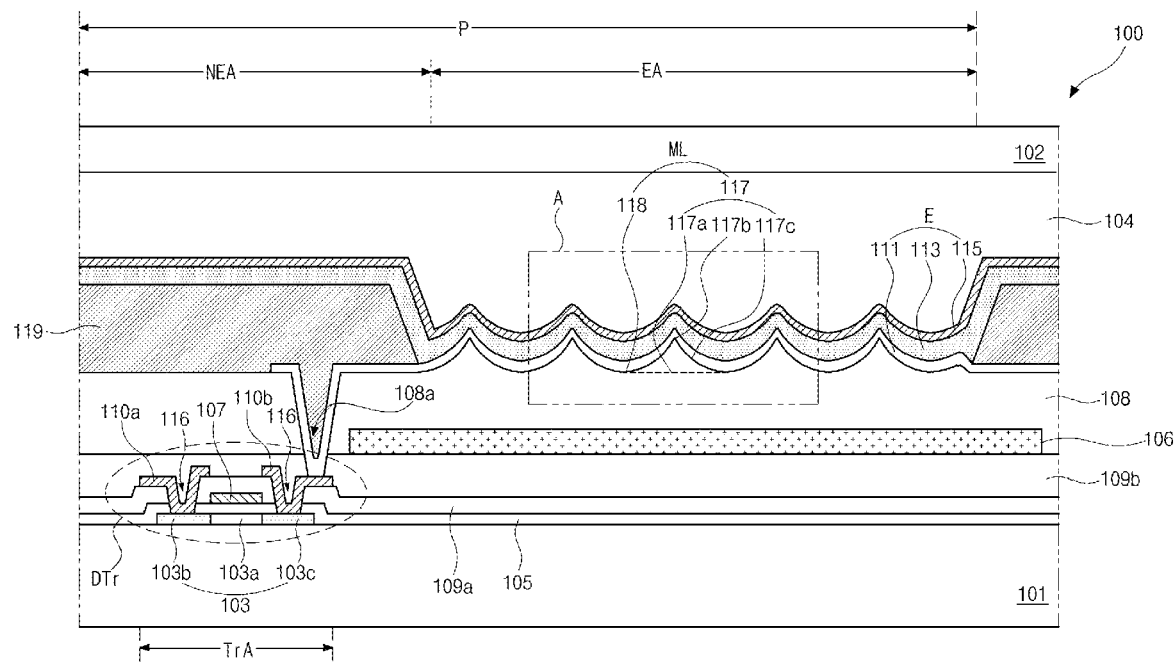
FIG. 1 is a cross-sectional view showing an organic light emitting diode display device according to an embodiment of the present disclosure.

FIG. 1 is a cross-sectional view showing an organic light emitting diode display device according to an embodiment of the present disclosure. The components of the organic light emitting diode display devices according to the various embodiments of the present disclosure are operatively coupled and configured.

In FIG. 1, an organic light emitting diode (OLED) display device 100 can have a top emission type or a bottom emission type according to an emission direction of a light. A bottom emission type OLED display device is exemplarily illustrated hereinafter.

The OLED display device 100 includes a substrate 101 having a driving thin film transistor (TFT) DTr and a light emitting diode E thereon and a protecting film 102 encapsulating the substrate 101.

The substrate 101 includes a plurality of pixel regions P and each pixel region P includes an emitting area EA where the light emitting diode E is disposed and an image is substantially displayed and a non-emitting area NEA along an edge of the emitting area EA. The non-emitting area NEA includes a switching area TrA where the driving TFT DTr is disposed.

A semiconductor layer 103 is disposed in the switching area TrA of the non-emitting area NEA of the pixel region P on the substrate 101. The semiconductor layer 103 can include silicon and can have an active region 103a in a central portion and source and drain regions 103b and 103c in both side portions of the active region 103a. The active region 103a can function as a channel of the driving TFT DTr, and the source and drain regions 103b and 103c can be doped with impurities of a relatively high concentration.

A gate insulating layer 105 is disposed on the semiconductor layer 103.

A gate electrode 107 and a gate line are disposed on the gate insulating layer 105. The gate electrode 107 corresponds to the active region 103a of the semiconductor layer 103. In one embodiment, as shown in FIG. 1, the gate electrode 107 directly overlies the active regions 103a. The gate line is electrically connected to the gate electrode 107 to extend along one direction.

A first interlayer insulating layer 109a is disposed on the gate electrode 107 and the gate line. The first insulating layer 109a and the gate insulating layer 105 has first and second semiconductor contact holes 116 exposing the source and drain regions 103b and 103c in both side portions of the active region 103a.

Source and drain electrodes 110a and 110b, which are spaced apart from each other by the gate electrode 107, are disposed on the first interlayer insulating layer 109a having the first and second semiconductor contact holes 116. The source electrode 110a is electrically connected to the source region 103b through the first semiconductor contact hole 116, and the drain electrode 110b is electrically connected to the drain region 103c through the second semiconductor contact hole 116.

A second interlayer insulating layer 109b is disposed on the source and drain electrodes 110a and 110b and the first interlayer insulating layer 109a exposed between the source and drain electrodes 110a and 110b.

The source and drain electrodes 110a and 110b, the semiconductor layer 103 including the source and drain regions 103b and 103c contacting the source and drain electrodes 110a and 110b, respectively, the gate insulating layer 105 and the gate electrode 107 constitute the driving TFT DTr.

A data line can be disposed on the second interlayer insulating layer 109b. The data line can cross the gate line to define each pixel region P. A switching TFT having the same structure as the driving TFT DTr can be electrically connected to the driving TFT DTr.

The switching TFT and the driving TFT DTr can exemplarily be one of an amorphous silicon (a-Si) TFT, a polycrystalline silicon (p-Si) TFT, a single crystal silicon (c-Si) TFT, and an oxide TFT according to the semiconductor layer 103. Although the switching TFT and the driving TFT DTr in the embodiment of FIG. 1 have a top gate type where the semiconductor layer 103 includes polycrystalline silicon or an oxide semiconductor material, the switching TFT and the driving TFT DTr can have a bottom gate type where the semiconductor layer 103 includes intrinsic amorphous silicon and impurity-doped amorphous silicon in another embodiment.

The substrate 101 may be made of glass or a transparent plastic flexible (bendable, foldable, rollable) material. When the substrate 101 includes a transparent plastic, polyimide, which has an excellent thermal resistance, can be used for the substrate 101 based on a deposition process of a high temperature. In one embodiment, the entire surface of the substrate 101 is covered with a buffer layer.

The driving TFT DTr in the switching area TrA can have a property that a threshold voltage is shifted by a light. To prevent the threshold voltage shift, a light shielding layer can be disposed under the semiconductor layer 103 in the OLED display device 100.

Since the light shielding layer between the substrate 101 and the semiconductor layer 103 blocks the light incident to the semiconductor layer 103 through the substrate 101, the threshold voltage shift of the driving TFT DTr due to the external light can be minimized or prevented. The light shielding layer can be covered with the buffer layer.

A wavelength converting layer 106 is disposed on the second interlayer insulating layer 109b corresponding to the emitting area EA of each pixel region P.

The wavelength converting layer 106 can include a color filter transmitting a light having a wavelength of a predetermined color corresponding to each pixel region P among a white light emitted from the light emitting diode E to the substrate 101.

The wavelength converting layer 106 can transmit a light having a wavelength corresponding to a red color, a green color or a blue color. For example, in the OLED display device 100, a single unit pixel region can include red, green, and blue pixel regions P, and the wavelength converting layer 106 in the red, green and blue pixel regions P can include red, green and blue color filters, respectively.

In the OLED display device 100, the single unit pixel region can further include a white pixel region where the wavelength converting layer 106 is not disposed.

In another embodiment, the wavelength converting layer 106 can include a quantum dot which have a size capable of emitting a light of a predetermined color corresponding to each pixel region P according to a white light emitted from the light emitting diode E to the substrate 101. Here, the quantum dot can include at least one selected from a group including CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and SbTe. However, a material of the quantum dot is not limited thereto.

For example, the wavelength converting layer 106 in the red pixel region can include a quantum dot of CdSe or InP, the wavelength converting layer 106 in the green pixel region can include a quantum dot of CdZnSeS, and the wavelength converting layer 106 in the blue pixel region can include a quantum dot of ZnSe. The OLED display device 100 where the wavelength converting layer 106 includes a quantum dot can have a relatively high color reproducibility.

In another embodiment, the wavelength converting layer 106 can include a color filter containing a quantum dot.

An overcoat layer 108 which has a first drain contact hole 108a exposing the drain electrode 110b with the second interlayer insulating layer 109b is disposed on the wavelength converting layer 106. The overcoating layer 108 has a plurality of concave portions 118 and a plurality of convex portions 117 on a top surface thereof. The plurality of concave portions 118 and the plurality of convex portions 117 are alternately disposed with each other to constitute a microlens ML. Stated differently, each of the concave portions 118 are spaced from another concave portion 118 by a convex portion 117.

The overcoating layer 108 can include an insulating material. In one embodiment, the overcoating layer 108 includes an insulating material having a refractive index of 1.5. For example, the overcoating layer 108 can include one or more of acrylic resin, epoxy resin, phenol resin, polyamide resin, polyimide resin, unsaturated polyester resin, polyphenylene resin, polyphenylenesulfide resin, benzocyclobutene, and photoresist. However, a material of the overcoating layer 108 is not limited thereto.

The plurality of convex portions 117 can have a structure to define or surround the plurality of concave portions 118, respectively, and can have a bottom portion axis 117a, a top surface portion 117b and a side surface portion 117c.

The side surface portion 117c can be a whole of a slanted surface constituting the top surface portion 117b. A slope of the side surface portion 117c can increase from the bottom portion axis 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 increases.

A first electrode 111 electrically connected to the drain electrode 110b of the driving TFT DTr is disposed on the overcoating layer 108 constituting the microlens ML. For example, the first electrode 111 can be an anode of the light emitting diode E and can include a material having a relatively high work function. In one embodiment, the first electrode 111 is transparent.

The first electrode 111 is disposed in each pixel region P, and a bank 119 is disposed between the first electrodes 111 in the adjacent pixel regions P. The first electrode 111 is separated in each pixel region P with the bank 119 as a border between the adjacent pixel regions P.

The bank 119 includes an opening exposing the first electrode 111, and the opening of the bank 119 is disposed to correspond to the emitting area EA. In one embodiment, the opening in the bank 119 is the same size as the emitting area EA. The plurality of convex portions 117 and the plurality of concave portions 118 constituting the microlens ML are disposed in a whole of the opening of the bank 119. For example, the plurality of convex portions 117 and the plurality of concave portions 118 can contact an edge portion of the bank 119.

Further, the opening of the bank 119 is disposed to correspond to the wavelength converting layer 106. Stated differently, the opening of the bank 119 is disposed to directly overlie the wavelength converting layer 106. For example, the edge portion of the bank 119 can overlap an edge portion of the wavelength converting layer 106. Since at least a portion of the wavelength converting layer 106 overlaps the bank 119, a leakage of a light not passing through the wavelength converting layer 106 is prevented.

A light emitting layer 113 is disposed on the first electrode 111. The light emitting layer 113 can have a single layer of an emitting material. Alternatively, the light emitting layer 113 can have a multiple layer including, for example, a hole injecting layer, a hole transporting layer, an emitting material layer, an electron transporting layer, and an electron injecting layer, for increasing an emission efficiency.

The first electrode 111 and the light emitting layer 113 sequentially on the overcoating layer 108 can have a shape according to a morphology of the plurality of convex portions 117 and the plurality of concave portions 118 of the top surface of the overcoating layer 108 to constitute the microlens ML. For example, as shown in FIG. 1, the portions of the first electrode 111 and the light emitting layer 113 in the opening of the bank 119 (i.e. in the emitting area EA) each include a plurality of convex portions and a plurality of concave portions that directly overlie the plurality of convex portions 117 and the plurality of concave portions 118, respectively, of the overcoating layer 108.

A second electrode 115 is disposed on the light emitting layer 113. For example, the second electrode 115 can be a cathode. In one embodiment, the second electrode 115 covers the entire light emitting layer 113. As shown in FIG. 1, the second electrode 115 is spaced from the first electrode 111 by the light emitting layer 113.

The second electrode 115 can have a shape according to a morphology of the plurality of convex portions 117 and the plurality of concave portions 118 of the top surface of the overcoating layer 108 to constitute the microlens ML. For example, as shown in FIG. 1, the portion of the second electrode 115 in the opening of the bank 119 (i.e. in the emitting area EA) includes a plurality of convex portions and a plurality of concave portions that directly overlie the plurality of convex portions 117 and the plurality of concave portions 118, respectively, of the overcoating layer 108.

When a voltage is applied to the first and second electrodes 111 and 115 according to a signal, a hole injected from the first electrode 111 and an electron injected from the second electrode 115 are transmitted to the light emitting layer 113 to constitute an exciton. When the exciton transitions from an excited state to a ground state, a light can be emitted from the light emitting layer 113 as a visible ray.

The light of the light emitting layer 113 can pass through the transparent first electrode 111 to be emitted toward an exterior such that an image is displayed.

Since the overcoating layer 108 constitutes the microlens ML, the light confined in the interior of the light emitting layer 113 due to a total reflection can be transmitted with an angle smaller than a critical angle of the total reflection by the microlens ML of the overcoating layer 108 to be extracted to the exterior by a multiple reflection. As a result, the light extraction efficiency of the OLED lighting apparatus 100 is improved.

In addition, since the microlens ML of the overcoating layer 108, the first electrode 111, the light emitting layer 113 and the second electrode 115 is disposed in a whole (i.e., extend the entire length) of the opening of the bank 119 corresponding to the emitting area EA, the whole of the emitting area EA is used for the microlens ML and the light extraction efficiency is maximized.

A protecting film 102 is disposed on the driving TFT DTr and the light emitting diode E, and a face seal 104 is disposed between the light emitting diode E and the protecting film 102. In one embodiment, the protecting film 102 is of a thin film type. The face seal 104 can include an organic material or an inorganic material that is transparent and has an adhesive property. The protecting film 102 and the substrate 101 can be attached to each other by the face seal 104 to encapsulate the OLED display device 100.

To prevent penetration of an external oxygen and a moisture into an interior of the OLED display device 100, the protecting film 102 can include at least two inorganic protecting films. Further, an organic protecting film for supplementing impact resistance of the at least two inorganic protecting films can be interposed between the at least two inorganic protecting films.

In the structure where the organic protecting film and the inorganic protecting film are alternately laminated with each other, the inorganic protecting film can completely wrap the organic protecting film such that penetration of the moisture and the oxygen through a side surface of the organic protecting film is prevented.

As a result, penetration of the moisture and the oxygen from the exterior to the interior of the OLED display device 100 can be prevented.

In the OLED display device 100, a polarizing plate for preventing reduction of a contrast ratio due to an external light can be disposed on an outer surface of the transparent substrate 101. Since the polarizing plate blocking the external light is disposed on a surface of the OLED display device 100 in a driving mode where a light from the light emitting layer 113 is emitted, the contrast ratio increases.

In the OLED display device 100, since the surface of the overcoating layer 108 constitutes the microlens ML, the first electrode 111, the light emitting layer 113 and the second electrode 115 sequentially on the overcoating layer 108 constitute the microlens ML. As a result, the light extraction efficiency of the light emitted from the light emitting diode E increases.

Figure 3:
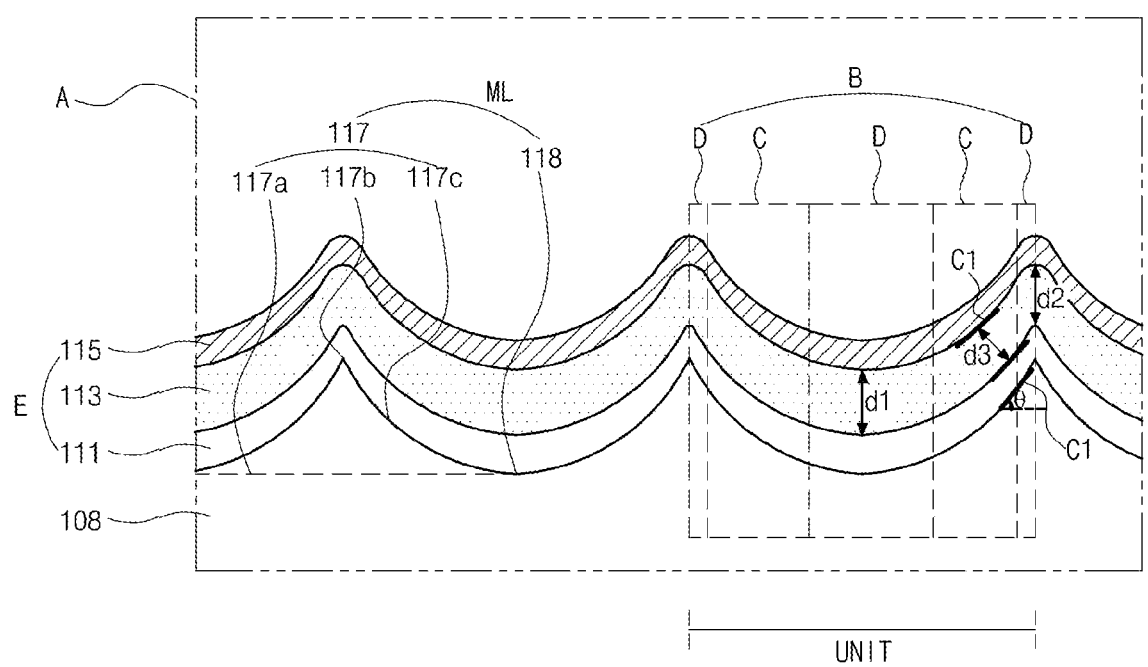
FIG. 3 is a magnified view of portion A of FIG. 1.

Specifically, since an effective emission region B (of FIG. 3) of the light emitting layer 113 is formed at the concave portion 118 as well as the side surface portion 117c of the convex portion 117, the effective emission region B can be classified into a main emission region C (of FIG. 3) and an auxiliary emission region D (of FIG. 3). As a result, a whole emission region of the light emitting layer 113 constituting the microlens ML can be enlarged and the light extraction efficiency can increase.

Since the emission spectrum of the auxiliary emission region D is adjusted to have various values, the efficiency can variously increase according to an object and an effect.

Figure 2:
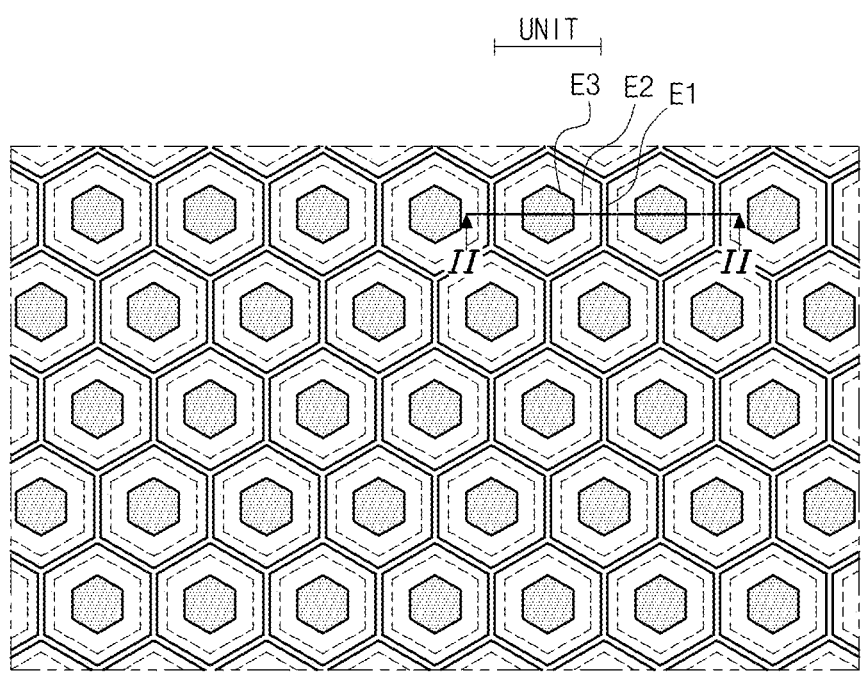
FIG. 2 is a plan view showing an organic light emitting diode display device according to an embodiment of the present disclosure.

FIG. 2 is a plan view showing an organic light emitting diode display device according to an embodiment of the present disclosure. In particular, FIG. 2 shows a region including the microlens ML of the OLED display device 100. It is noted that the protecting film 102 and the face seal 104 are not shown in FIG. 2. FIG. 3 is a magnified view of portion A of FIG. 1. The portion A is a cross-sectional view taken along a line II-II of FIG. 2. It is beneficial to review FIGS. 2 and 3 together.

As best shown in FIG. 2, in one embodiment, a region including the microlens ML of the OLED display device 100 (of FIG. 1) can have hexagonal shapes in a plan view. More specifically, in a plan view, the top surface portions 117b of the convex portion 117 of the overcoating layer 108 may form hexagonal shapes. For example, as shown in FIG. 2, the region including the microlens ML can have a hexagonal honeycomb structure in a plan view. In addition, the concave portions 118 can be arranged in a line along a first direction (a horizontal direction) and a diagonal direction and can be staggered along a second direction (a vertical direction). Further, the adjacent concave portions 118 can be connected to each other through a connecting portion (the convex portion 117), and the connecting portion (the convex portion 117) can constitute a hexagonal shape or a honeycomb structure in a plan view.

However, the region including the microlens ML is not limited thereto and can include various shapes, such as half circular shapes, half elliptical shapes, and rectangular shapes.

The region including the microlens ML can be classified into first regions E1 corresponding to the top surface portion 117b of the convex portions 117 of the overcoating layer 108, second regions E2 corresponding to the side surface portion 117c of the convex portions 117 of the overcoating layer 108 between the convex portion 117 and the concave portion 118, and third regions E3 corresponding to the concave portions 118 of the overcoating layer 108. The first regions E1, the second regions E2, and the third regions E3 together forms recesses having a base portion formed by the third region E3 and a sidewall portion formed by the second regions E2. The recesses are separated from each other by the first regions E1.

In FIG. 3, each of the convex portions 117 of the overcoating layer 108 constituting the microlens ML can have a bottom portion axis 117a, a top surface portion 117b and a side surface portion 117c. The side surface portion 117c is a slanted surface constituting the top surface portion 117b that extends between the bottom portion axis 117a and the top surface portion 117b. In one embodiment, as best shown in FIG. 3, the side surface portion 117c is curved.

As best shown in FIG. 2, the top surface portion 117b of the convex portion 117 of the overcoating layer 108 corresponds to the first region E1 in a plan view. The side surface portion 117c corresponds to the second region E2, and the concave portion 118 corresponds to the third region E3.

For example, referring to FIG. 3, an angle θ of a tangential line C1 of the side surface portion 117c with respect to a horizontal surface (e.g., the bottom portion axis 117a) can be within a range of 20 degrees to 60 degrees. When the angle θ is smaller than 20 degrees, the transmission angle of the light in the light emitting layer 113 having the microlens ML is not greatly changed as compared with the transmission angle of the light in a flat light emitting layer. As a result, the light extraction efficiency is insufficiently improved.

When the angle θ is greater than 60 degrees, the transmission angle of the light in the light emitting layer 113 becomes greater than the critical angle of the total reflection at an interface of the substrate 101 (of FIG. 1) and an external air layer. As a result, the amount of the light confined in the OLED display device 100 increases and the light extraction efficiency of the light emitting layer 113 having the microlens ML decreases as compared with the light extraction efficiency of a flat light emitting layer.

Accordingly, the angle θ of the tangential line C1 of the side surface portion 117c with respect to the horizontal surface (e.g., the bottom portion axis 117a) can be determined within a range of 20 degrees to 60 degrees. For example, the angle θ of the tangential line C1 of the concave portion 118 and the top surface portion 117b with respect to the horizontal surface (e.g., the bottom portion axis 117a) can be smaller than 20 degrees, and the angle θ of the tangential line C1 of the side surface portion 117c with respect to the horizontal surface (e.g., the bottom portion axis 117a) can be greater than 20 degrees.

To further increase the light extraction efficiency of the light emitting layer 113, the convex portion 117 of the overcoating layer 108 can have a structure where the top surface portion 117b has a sharp shape. For example, the convex portion 117 can have a cross-section of triangle shape including a vertex corresponding to the top surface portion 117b, a bottom side corresponding to the bottom portion axis 117a and a hypotenuse corresponding to the side surface portion 117c.

The angle θ of the side surface portion 117c of the convex portion 117 of the overcoating layer 108 (relative to the bottom portion axis 117a) can gradually increase from the bottom portion axis 117a to the top surface portion 117b. The angle θ is defined as an angle between the tangential line C1 of the side surface portion 117c and a horizontal surface (e.g., the bottom portion axis 117a). The side surface portion 117c can have the maximum slope Smax when the angle θ becomes the maximum value. The slope can be defined by a tangent value of the angle (tan θ).

Referring to FIG. 3, in the OLED display device 100, since the light emitting layer 113 is disposed on the overcoating layer 108 constituting the microlens ML, the light emitting layer 113 can have different thicknesses d1, d2 and d3 in different regions. The light emitting layer 113 can be formed to have the different thicknesses d1, d2 and d3 corresponding to the concave portion 118 and the convex portion 117 of the microlens ML. For example, as shown in FIG. 3, the portion of the light emitting layer 113 that overlies the concave portion 118 has a thickness d1, the portion of the light emitting layer 113 that overlies the top surface portion 117b has a thickness d2, and the portion of the light emitting layer 113 that overlies the side surface portion 117c has a thickness d3.

The thickness of the light emitting layer 113 can be defined as a length perpendicular to the tangential line C1 of the light emitting layer 113. In one embodiment, the third thickness d3 of the light emitting layer 113 that overlies the side surface portion 117c of the convex portion 117 of the microlens ML is smaller than the thicknesses d1 of the light emitting layer 113 that overlies the concave portion 118 and smaller than the thickness d2 of the light emitting layer 113 that overlies the top surface portion 117b of the convex portion 117. In one embodiment, the thickness d1 is equal to or greater than the thickness d2.

Since the light emitting layer 113 is formed on the overcoating layer 108 having the microlens ML, the side surface portion 117c of the convex portion 117 of the overcoating layer 108 can have the angle θ (relative to the bottom portion axis 117a) gradually increasing from the bottom portion axis 117a to the top surface portion 117b. As a result, the third thickness d3 of the light emitting layer 113 above the side surface portion 117c is smaller than the first and second thicknesses d1 and d2 of the light emitting layer 113 above the concave portion 118 and the top surface portion 117b.

In the light emitting diode E, the light emission occurs in a region having a relatively high current density. Since the light emitting layer 113 has a relatively small thickness d3 above the side surface portion 117c of the convex portion 117 as compared with the concave portion 118 and the top surface portion 117b of the convex portion 117, the light emitting layer 113 can have a relatively high current density and a relatively strong light emission in the side surface portion 117c of the convex portion 117. In addition, since the light emitting layer 113 has a relatively great thickness d1 in the concave portion 118 and the top surface portion 117b of the convex portion 117, the light emitting layer 113 can have a relatively low current density and a relatively weak light emission in the concave portion 118 and the top surface portion 117b of the convex portion 117.

As a result, in the OLED display device 100, referring to FIG. 3, the side surface portion 117c of the convex portion 117 where the strong light emission occurs can be defined as a main emission region C. When the light emitting diode E is driven, an electric field locally concentrates on the main emission region C to generate a main current path and a main emission occurs.

The concave portion 118 and the top surface portion 117b of the convex portion 117 where the weak light emission occurs as compared with the main emission region C can be defined as an auxiliary emission region D. The main emission region C and the auxiliary emission region D constitute an effective emission region B of the OLED display device 100.

In the OLED display device 100, when an area (a diameter) corresponding to a distance between the adjacent top surface portions 117b of the convex portion 117 is defined as a unit cell UNIT, a whole of the unit cell UNIT constitutes the main emission region B.

A current density difference of the main emission region C and the auxiliary emission region D can be within a range of 0.0001 A/cm$^2$ to 0.05 A/cm$^2$.

When the current density difference of the main emission region C and the auxiliary emission region D is smaller than 0.0001 A/cm$^2$ or the current density difference of the main emission region C and the auxiliary emission region D is greater than 0.05 A/cm$^2$, the light emission cannot substantially occur in the auxiliary emission region D or a relatively high current can be applied to the main emission region C.

For example, when a current of 0.06 A/cm$^2$ is applied to the main emission region C, a current of 0.01 A/cm$^2$ to 0.0599 A/cm$^2$ can be applied to the auxiliary emission region D such that the current density difference of the main emission region C and the auxiliary emission region D is within a range of 0.0001 A/cm$^2$ to 0.05 A/cm$^2$.

When a current having a current density smaller than 0.01 A/cm$^2$ is applied to the auxiliary emission region D, the light emission cannot substantially occur in the auxiliary emission region D. When a current having a current density greater than 0.05 A/cm$^2$ is applied to the auxiliary emission region D, the current applied to the main emission region C increases and the total driving current for driving the OLED display device 100 increases.

When the total driving current increases, the OLED display device 100 is deteriorated and the emission efficiency of the OLED display device 100 is reduced. As a result, the lifetime of the OLED display device 100 is shortened. In addition, since deterioration of the OLED display device 100 is different for the pixel region P (of FIG. 1), the difference in deterioration of the pixel region P can cause a luminance deviation.

Accordingly, the current density difference between the main emission region C and the auxiliary emission region D can be within a range of 0.0001 A/cm$^2$ to 0.05 A/cm$^2$.

In the OLED display device 100 where the main emission region C and the auxiliary emission region D constitute the effective emission region B, since the effective emission region B of the light emitting layer 113 constituting the microlens ML is enlarged, the light extraction efficiency can increase.

Although the emission amount of the auxiliary emission region D is smaller than the emission amount of the main emission region C, the total emission amount of the OLED display device 100 increases as compared with, for example, the OLED display device including the main emission region C and not the auxiliary emission region D.

Specifically, in the OLED display device 100, since the thicknesses d1, d2 and d3 of the light emitting layer 113 are different in the main emission region C and the auxiliary emission region D, the light emitting layer 113 has different emission spectrums in the main emission region C and the auxiliary emission region D.

Accordingly, in the OLED display device 100, the light emitted from the main emission region C is used for displaying an image and the light emitted from the auxiliary emission region D is used for assisting or compensating the light emitted from the main emission region C.

Figure 4:
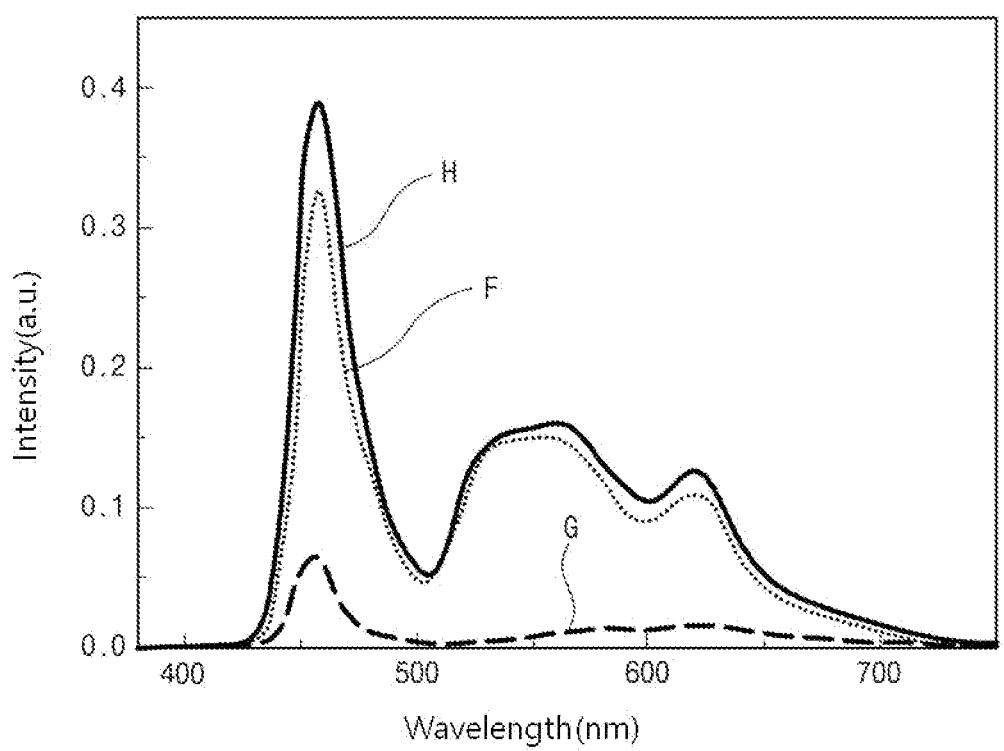
FIG. 4 is a graph showing an emission spectrum of a white light emitted from a main emission region and an auxiliary emission region of an organic light emitting diode display device according to an embodiment of the present disclosure.

FIG. 4 is a graph showing an emission spectrum of a white light emitted from a main emission region and an auxiliary emission region of an organic light emitting diode display device according to an embodiment of the present disclosure.

In FIG. 4, the x-axis represents a wavelength of a light and the y-axis represents an intensity of a light. The intensity is a relative value with respect to the maximum of the emission spectrum. For example, the value of 0.34 (arbitrary unit: a.u.) of the blue emission spectrum can be the maximum and the relative value of the yellow-green emission spectrum with respect to the maximum can be shown.

A curve F represents an emission spectrum of a white light emitted from the main emission region C, and a curve G represents an emission spectrum of a white light emitted from the auxiliary emission region D. Since the intensity of the light emitting layer 113 depends on the applied current, the emission spectrums of the curves F and G are measured by applying the same current to the light emitting diode E. The emission spectrum of curve F can have peaks corresponding to a red light, a green light and a blue light.

The emission spectrum of the curve G is smaller than the emission spectrum of the curve F. As a result, the main emission region C and the auxiliary emission region D have different emission spectrums.

In addition, a relatively strong light emission occurs in the main emission region C as compared with the auxiliary emission region D, and a relatively weak light emission occurs in the auxiliary emission region D as compared with the main emission region C.

In the main emission region C, since the light emitting layer 113 having a relatively small thickness d3 has a relatively high current density, the main light emission occurs. In the auxiliary emission region D, since the light emitting layer 113 having a relatively great thickness d1 and d2 has a relatively low current density, the auxiliary light emission occurs.

A curve H represents an emission spectrum of a whole of a white light emitted from the OLED display device 100. The emission spectrum of the curve H corresponding to the main emission region C and the auxiliary emission region D is greater than the emission spectrum of the curve F corresponding to the main emission region C. (H=F+G)

In the OLED display device 100, since the main emission region C and the auxiliary emission region D constitute the effective emission region B, the effective emission region B of the light emitting layer 113 constituting the microlens ML is enlarged and the light extraction efficiency increases.

In one embodiment, the emission spectrum of the auxiliary emission region D is variously adjusted by changing one or more of the current applied to the light emitting diode E, the thicknesses d1 and d2 of the concave portion 118 and the top surface portion 117b of the convex portion 117 of the microlens ML and the shape of the microlens ML.

FIG. 5A is a graph showing an emission spectrum of an auxiliary emission region of an organic light emitting diode display device according to an embodiment of the present disclosure.

In FIG. 5A, the auxiliary emission region D of the OLED display device 100 is designed such that the emission efficiencies of a blue light and a red light similarly increase. The emission spectrum of FIG. 5A can have two peaks corresponding to wavelengths of a red light and a blue light.

Figure 5B:
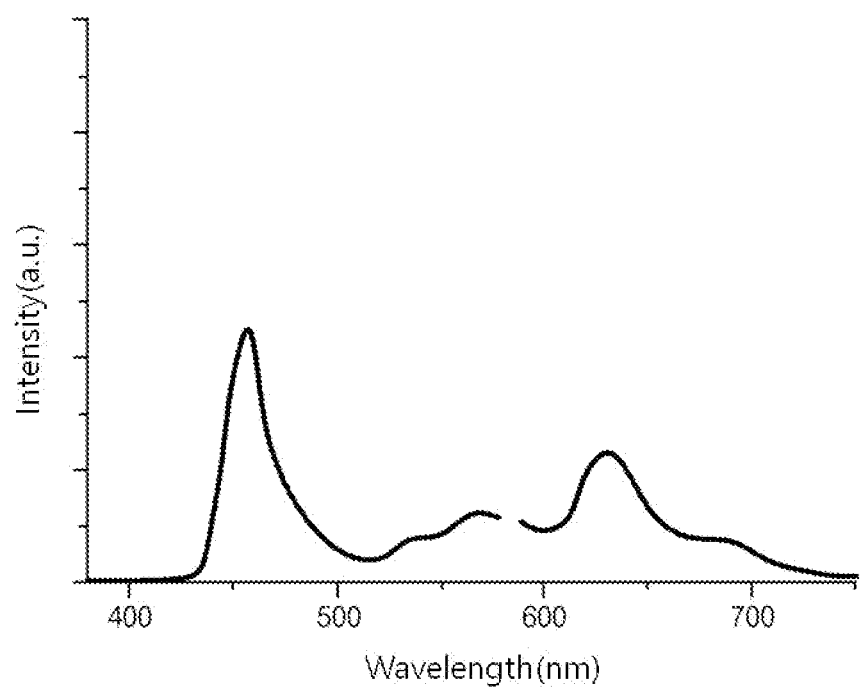

FIG. 5B is a graph showing an emission spectrum of an auxiliary emission region of an organic light emitting diode display device according to an embodiment of the present disclosure.

In FIG. 5B, the auxiliary emission region D of the OLED display device 100 is designed such that the emission efficiencies of a blue light, a green light and a red light similarly increase. The emission spectrum of FIG. 5B can have three peaks corresponding to wavelengths of a red light, green light and a blue light.

Figure 5C:
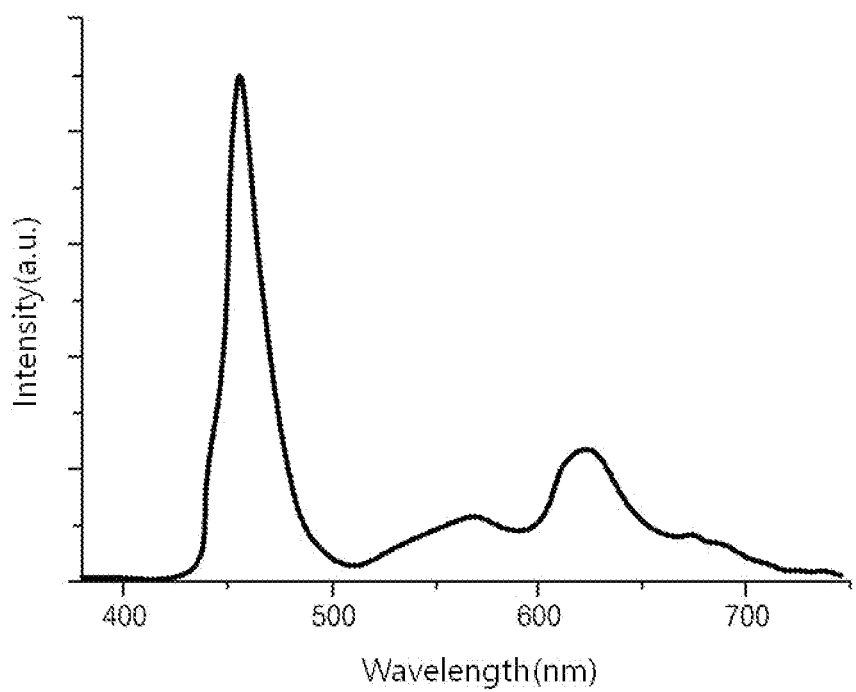

FIG. 5C is a graph showing an emission spectrum of an auxiliary emission region of an organic light emitting diode display device according to an embodiment of the present disclosure.

In FIG. 5C, the auxiliary emission region D of the OLED display device 100 is designed such that the emission efficiency of a red light further increases than the emission efficiency of a green light and the emission efficiency of a blue light further increases than the emission efficiency of a red light. The emission spectrum of FIG. 5C can have three peaks corresponding to wavelengths of a red light, a green light and a blue light.

Figure 5D:
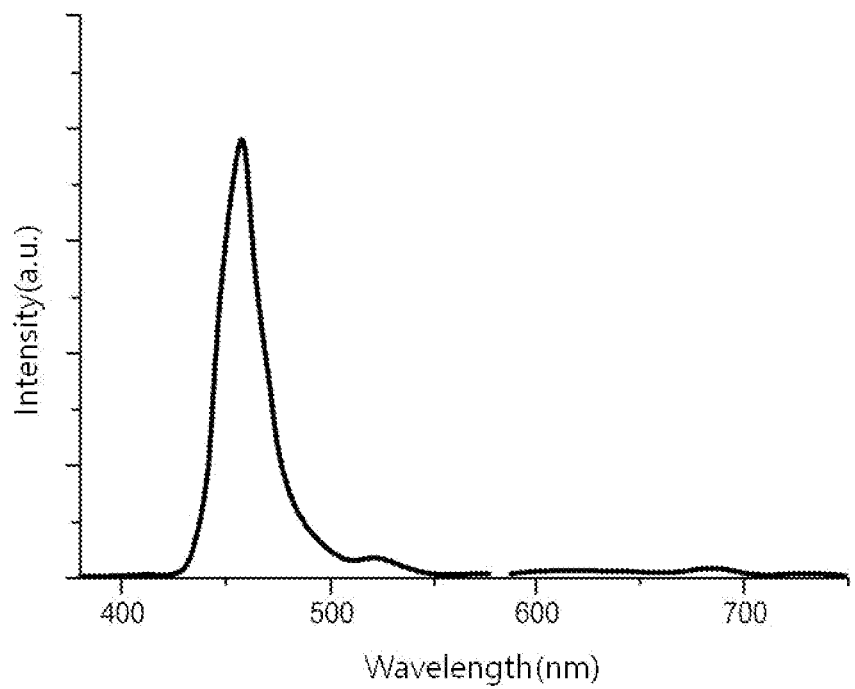

FIG. 5D is a graph showing an emission spectrum of an auxiliary emission region of an organic light emitting diode display device according to an embodiment of the present disclosure. The emission spectrum of FIG. 5D can have one peak corresponding to a blue light.

In FIG. 5D, the auxiliary emission region D of the OLED display device 100 is designed such that the emission efficiency of a blue light increases.

In one embodiment, the main emission region C has the same emission spectrum in FIGS. 5A to 5D. An x color coordinate (Wx) and a y color coordinate (Wy) of the white light of the OLED display device including the auxiliary emission region D of FIG. 5A are reduced as compared with the OLED display device including the auxiliary emission region D of FIGS. 5C and 5D. An x color coordinate and a y color coordinate of the white light of the OLED display device including the auxiliary emission region D of FIG. 5B are not changed. An x color coordinate of the white light of the OLED display device including the auxiliary emission region D of FIG. 5C is reduced.

An x color coordinate and an y color coordinate of the white light of the OLED display device including the auxiliary emission region D of FIG. 5D are reduced, and a variation ($\Delta Wx$) in an x color coordinate is smaller than a variation ($\Delta Wy$) in a y color coordinate in the OLED display device including the auxiliary emission region D of FIG. 5D.

The emission spectrum of the auxiliary emission region D can affect the whole of the emission spectrum of the OLED display device 100. Specifically, the emission spectrum of the auxiliary emission region D can be variously designed according to the object and the effect.

For example, in the OLED display device 100 including the auxiliary emission region D of FIG. 5B, since the efficiencies of the red light, the green light and the blue light increase as compared with the OLED display device including the main emission region C and not the auxiliary emission region D, the emission efficiency increases and the efficiency of the full color driving increases.

In addition, in the OLED display device 100 including the auxiliary emission region D of FIG. 5D, since the efficiency of the blue light increases, a color temperature of the OLED display device 100 increases.

As a result, the light emitted from the auxiliary emission region D can assist or compensate the property of the light emitted from the main emission region C.

In the OLED display device 100, since the effective emission region B includes the main emission region C and the auxiliary emission region D, the whole of the effective emission region B of the light emitting layer 113 constituting the microlens ML is enlarged and the light extraction efficiency increases.

In addition, since the main emission region C and the auxiliary emission region D have different emission spectrums and the emission spectrum of the auxiliary emission region D is variously designed according to the object and the effect, the light emitted from the auxiliary emission region D can assist or compensate the light emitted from the main emission region C. As a result, the emission efficiency increases and the light having various properties is emitted.

Although the microlens ML is disposed in the emitting area EA (of FIG. 1) in the embodiment, the microlens ML can be disposed to extend to the non-emitting area NEA (of FIG. 1) in another embodiment.

When the microlens ML is disposed in the non-emitting area NEA, the light extraction efficiency further increases due to a path change of the light toward the non-emitting area NEA and a light leakage toward the adjacent pixel region P (of FIG. 1) is prevented.

Consequently, in the OLED display device according to an embodiment of the present disclosure, since the effective emission region includes both of the main emission region and the auxiliary emission region, the whole of the effective emission region of the light emitting layer constituting the microlens is enlarged and the light extraction efficiency is further improved.

In addition, in one embodiment, the main emission region and the auxiliary emission region have different emission spectrums. Specifically, since the emission spectrum of the auxiliary emission region is variously designed according to the object and the effect, the light emitted from the auxiliary emission region assists or compensates the light emitted from the main emission region. As a result, the emission efficiency is further improved and the light having various properties is emitted.

The present disclosure also relates to and is not limited to the following embodiments.

In one embodiment, an organic light emitting diode display device includes: a substrate having an emitting area a non-emitting area; an overcoating layer on the substrate and including a convex portion and a concave portion, the convex portion including a top surface portion and a side surface portion between the concave portion and the top surface portion, the side surface portion being in a first emission region having a first emission spectrum, the concave portion being in a second auxiliary emission region having a second emission spectrum different from the first emission spectrum; a first electrode on the overcoating layer; a light emitting layer on the first electrode; and a second electrode on the light emitting layer.

In one embodiment, the top surface portion is in a third emission region having the second emission spectrum.

In one embodiment, an angle between a surface of the side surface portion and a surface of the substrate is within a range of 20 degrees to 60 degrees, an angle between a surface of the concave portion and the surface of the substrate is smaller than 20 degrees, and an angle between a surface of the top surface portion and the surface of the substrate is smaller than 20 degrees.

In one embodiment, an electrical current density difference between the first emission region and the second emission region is within a range of 0.0001 A/cm$^2$ to 0.05 A/cm$^2$.

In one embodiment, the second emission spectrum compensates the first emission spectrum.

In one embodiment, a portion of the side surface portion closest to the concave portion has a first slope, and a portion of the side surface portion closest to the top surface portion has a second slope that is greater than the first slope.

In one embodiment, a portion of the light emitting layer that overlies the portion of the side surface portion closest to the concave portion has a first thickness, and a portion of the light emitting layer that overlies the portion of the side surface portion closest to the top surface portion has a second thickness that is smaller than the first thickness.

In one embodiment, a portion of the light emitting layer that overlies the convex portion has a first thickness, and a portion of the light emitting layer that overlies the concave portion has a second thickness that is greater than the first thickness.

In one embodiment, the first emission spectrum has peaks corresponding to wavelengths of a red light, a green light and a blue light, and the second emission spectrum has at least one peak corresponding to wavelengths of at least one of the red light, the green light, or the blue light.

In one embodiment, the second emission spectrum has two peaks corresponding to the wavelengths of the red light and the blue light.

In one embodiment, the second emission spectrum has three peaks corresponding to the wavelengths of the red light, the green light and the blue light.

In one embodiment, the second emission spectrum has one peak corresponding to the wavelength of the blue light.

In one embodiment, the organic light emitting diode display device further includes: a wavelength converting layer interposed between the substrate and the overcoating layer; and a bank over the overcoating layer and including an opening exposing the first electrode, an edge portion of the wavelength converting layer extends beyond an edge portion of the convex portion and the concave portion toward the non-emitting area, or the convex portion and the concave portion are formed in the opening.

In one embodiment, the convex portion and the concave portion contact an edge portion of the bank, the bank overlays an edge portion of the convex portion and the concave portion, or an edge portion of the wavelength converting layer, or an edge portion of the convex portion and the concave portion and an edge portion of the bank overlap one another in the non-emitting area.

In one embodiment, a border portion of the emitting area and the non-emitting area overlaps an edge portion of the convex portion and the concave portion.

In one embodiment, the concave portion is arranged in a line along a first direction and is staggered along a second direction.

In one embodiment, the convex portion constitutes one of a hexagonal shape and a honeycomb structure in a plan view.

In one embodiment, a display device includes: a substrate; an overcoat layer on the substrate, the overcoat layer including a first plurality of recesses; a first electrode on the overcoat layer, the first electrode including a second plurality of recesses; a light emitting layer on the first electrode, the light emitting layer including a third plurality of recesses; and a second electrode on the light emitting layer, the second electrode including a fourth plurality of recesses, the first, second, third, and fourth plurality of recesses being aligned with each other.

In one embodiment, the overcoat layer includes a plurality of concave portions that forms bases of the first plurality of recesses, and a plurality of convex portions that forms sidewalls of the first plurality of recesses.

In one embodiment, each of the plurality of concave portions has a first thickness, and each of the plurality of convex portions has a second thickness that is smaller than the first thickness.

In one embodiment, the plurality of convex portions are in a first emission region having a first emission spectrum, and the plurality of concave portions are in a second emission region having a second emission spectrum.

In one embodiment, a display device includes: a substrate; a first electrode on the substrate, the first electrode including a first plurality of concave portions and a first plurality of convex portions; a light emitting layer on the first electrode, the light emitting layer including a second plurality of concave portions and a second plurality of convex portions; and a second electrode on the light emitting layer, the second electrode including a third plurality of concave portions and a third plurality of convex portions, the first, second, and third plurality of concave portions being aligned with each other, the first, second, and third plurality of convex portions being aligned with each other, the first, second, and third plurality of convex portions being in a first emission region having a first emission spectrum, the first, second, and third plurality of concave portions being in a second emission region having a second emission spectrum.

In one embodiment, the first emission spectrum includes peaks corresponding to wavelengths of a red light, a green light and a blue light, and the second emission spectrum includes at least one peak corresponding to wavelengths of at least one of the red light, the green light, or the blue light.

In one embodiment, each of the first, second, and third plurality of concave portions has a first thickness, and each of the first, second, and third plurality of convex portions has a second thickness that is smaller than the first thickness.

In one embodiment, the organic light emitting diode display device further includes: an overcoat layer between the substrate and the first electrode, the overcoat layer including a fourth plurality of concave portions and a fourth plurality of convex portions.

It will be apparent to those skilled in the art that various modifications and variation can be made to the various embodiments of the present disclosure without departing from the spirit or scope of the present disclosure. Thus, it is intended that the various embodiments of the present disclosure cover the modifications and variations provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode display device, comprising:
    a substrate having a light emitting area and a non-light emitting area;
    an overcoating layer on the substrate and including a convex portion and a concave portion, the convex portion including a top surface portion and a side surface portion between the concave portion and the top surface portion;
    a first electrode on the overcoating layer;
    a light emitting layer on the first electrode; and
    a second electrode on the light emitting layer,
    wherein a light emitted from the light emitting layer corresponding to the side surface portion has a first emission spectrum, and a light emitted from the light emitting layer corresponding to the concave portion has a second emission spectrum different from the first emission spectrum, and
    wherein a first thickness of the light emitting layer corresponding to the concave portion is equal to or greater than a second thickness of the light emitting layer corresponding to the convex portion, and a third thickness of the light emitting layer corresponding to the side surface portion is smaller than the second thickness.

2. The organic light emitting diode display device of claim 1, wherein an intensity of the first emission spectrum is greater than an intensity of the second emission spectrum.

3. The organic light emitting diode display device of claim 1, wherein the first emission spectrum has three peaks corresponding to wavelengths of a red light, a green light and a blue light, and the second emission spectrum has at least one peak corresponding to wavelengths of at least one of the red light, the green light, or the blue light.

4. The organic light emitting diode display device of claim 3, wherein the second emission spectrum has two peaks corresponding to the wavelengths of the red light and the blue light.

5. The organic light emitting diode display device of claim 3, wherein the second emission spectrum has three peaks corresponding to the wavelengths of the red light, the green light and the blue light.

6. The organic light emitting diode display device of claim 5, wherein a peak of the second emission spectrum corresponding to the wavelength of the red light is greater than a peak of the second emission spectrum corresponding to the wavelength of the green light and is smaller than a peak of the second emission spectrum corresponding to the wavelength of the blue light.

7. The organic light emitting diode display device of claim 3, wherein the second emission spectrum has one peak corresponding to the wavelength of the blue light.

8. The organic light emitting diode display device of claim 1, wherein a light emitted from the light emitting layer corresponding to the top surface portion has the second emission spectrum.

9. The organic light emitting diode display device of claim 8, wherein an angle between a surface of the side surface portion and a surface of the substrate is within a range of about 20 degrees to about 60 degrees, an angle between a surface of the concave portion and the surface of the substrate is smaller than about 20 degrees, and an angle between a surface of the top surface portion and the surface of the substrate is smaller than about 20 degrees.

10. The organic light emitting diode display device of claim 1, wherein a first electrical current density of the light emitting layer corresponding to the side surface portion is greater than a second current density of the light emitting layer corresponding to the concave portion, and an electrical current density difference of the light emitting layer between the side surface portion and the concave portion is within a range of about 0.0001 A/cm$^2$ to about 0.05 A/cm$^2$.

11. The organic light emitting diode display device of claim 1, wherein the second emission spectrum compensates the first emission spectrum.

12. The organic light emitting diode display device of claim 1, wherein a portion of the side surface portion closest to the concave portion has a first slope, and a portion of the side surface portion closest to the top surface portion has a second slope that is greater than the first slope.

13. The organic light emitting diode display device of claim 12, wherein a portion of the light emitting layer that overlies the portion of the side surface portion closest to the concave portion has a fourth thickness, and a portion of the light emitting layer that overlies the portion of the side surface portion closest to the top surface portion has a fifth thickness that is smaller than the fourth thickness.

14. The organic light emitting diode display device of claim 1, further comprising:
   a wavelength converting layer interposed between the substrate and the overcoating layer; and
   a bank over the overcoating layer and including an opening exposing the first electrode,
   wherein either an edge portion of the wavelength converting layer extends beyond an edge portion of the convex portion and the concave portion toward the non-light emitting area, or the convex portion and the concave portion are formed in the opening.

15. The organic light emitting diode display device of claim 14, wherein the convex portion and the concave portion contact an edge portion of the bank, and
   wherein the bank overlays an edge portion of the convex portion and the concave portion.

16. The organic light emitting diode display device of claim 14, wherein the convex portion and the concave portion contact an edge portion of the bank, and
   wherein an edge portion of the wavelength converting layer, an edge portion of the convex portion and the concave portion and an edge portion of the bank overlap one another in the non-light emitting area.

17. The organic light emitting diode display device of claim 1, wherein a border portion of the light emitting area and the non-light emitting area overlaps an edge portion of the convex portion and the concave portion.

18. The organic light emitting diode display device of claim 1, wherein the concave portion is arranged in a line along a first direction and is staggered along a second direction.

19. The organic light emitting diode display device of claim 1, wherein the convex portion constitutes one of a hexagonal shape and a honeycomb structure in a plan view.

20. The organic light emitting diode display device of claim 1, wherein the convex portion and the concave portion extend from the light emitting area to the non-light emitting area.

* * * * *